(12) United States Patent
Lu

(10) Patent No.: US 6,765,506 B1
(45) Date of Patent: Jul. 20, 2004

(54) SCRAMBLER, DE-SCRAMBLER, AND RELATED METHOD

(75) Inventor: KehShehn Lu, Hsin-Tien (TW)

(73) Assignee: Via Technologies Inc., Hsin-Tien (TW)

( * ) Notice: Subject to any disclaimer, the term of this patent is extended or adjusted under 35 U.S.C. 154(b) by 0 days.

(21) Appl. No.: 10/248,284

(22) Filed: Jan. 6, 2003

(51) Int. Cl.$^7$ .............................................. H03M 7/00
(52) U.S. Cl. ........................... 341/50; 708/252; 380/44; 377/75
(58) Field of Search ............................. 341/50; 708/252, 708/253, 254; 380/44, 45, 46, 47, 268; 377/75, 76, 77, 111

(56) References Cited

U.S. PATENT DOCUMENTS

| | | | |
|---|---|---|---|
| 4,730,340 A | * | 3/1988 | Frazier, Jr. .................. 375/150 |
| 4,965,881 A | | 10/1990 | Dilley |
| 5,434,807 A | * | 7/1995 | Yoshida ...................... 708/253 |
| 5,446,683 A | * | 8/1995 | Mullen et al. .............. 708/256 |
| 5,910,907 A | | 6/1999 | Chen et al. |
| 6,014,408 A | * | 1/2000 | Naruse et al. .............. 375/130 |
| 6,067,359 A | * | 5/2000 | Shimada ...................... 380/46 |
| 6,141,669 A | | 10/2000 | Carleton |

OTHER PUBLICATIONS

3rd Generation Partnership Project 2 "3GPP2" Physical Layer Standard for cdma 2000 Spread Spectrum Systems Date Unknown.

* cited by examiner

Primary Examiner—Howard L. Williams
(74) Attorney, Agent, or Firm—Winston Hsu

(57) ABSTRACT

A scrambler includes a linear shift register having logic suitable for generating a scrambling sequence according to a predetermined generator sequence, a plurality of logic gates that allow for parallel input to the shift register, and a multiplexer for switching inputs of the shift register. The multiplexer switches inputs so that the shift register can be loaded with a predetermined initial value, and shifted a single bit or shifted a predetermined number of bits though the generator sequence.

17 Claims, 4 Drawing Sheets

SCRAMBLER, DE-SCRAMBLER, AND RELATED METHOD

BACKGROUND OF INVENTION

1. Field of the Invention

The present invention relates to an electronic device, and more specifically to an electronic scrambler/de-scrambler and related method for generating a scrambling sequence.

2. Description of the Prior Art

Modern communications systems have developed rapidly and become a fixture of the information age. Mobile (or cellular) phones are a prime example of how new technology can change people's lives. Mobile phones offer an inexpensive and convenient way to stay in touch with family, friends, and colleagues. The popularity of mobile phones has led to widespread use, which has created a demand for new functionality and associated advances in technology.

Recently, industry and standardization groups have developed the code division multiple access specification (cdma2000) for third generation (3G wireless communication systems. The cdma2000 system offers expanded functionality to mobile phones such as capabilities for sending pictures, Internet access, and expanded voice functionality.

A key element in most communications devices, including 3G mobile phones, is a scrambler/de-scrambler. A scrambler encodes data so that it can be safely transmitted. From the base station transmitter path, the channel interleaved symbols are scrambled before being fed into a subpacket symbol selection device. A source unit uses a scrambler to scramble data, and then transmits the scrambled data to a destination unit that uses a similar scrambler to descramble the data. The de-scrambler needs to generate the same scrambling sequence as the scrambler. The subpacket symbol selection selects a scrambled sequence start from an Fk value, wherein k is the subpacket index and the Fk value ranges from 72 to 7776 in steps of 24 (i.e. 72, 96 . . . 7752, 7776). According to cdma2000, the Fk value depends on a host of parameters including: an index of a subpacket being scrambled, a number of bits in an encoder packet (a plurality of subpackets), a number of 32-bit Walsh channels indexed by subpacket, a number of 1.25 ms slots for a subpacket, and a modulation order of each subpacket. All of these parameters and how they correlate are well known to those working in the cdma2000 field and are prescribed by the relevant cdma2000 specifications. If an unintended destination unit receives the scrambled data, it is likely that the unintended destination cannot readily descramble or understand the data. Encrypting data using a scrambler serves to protect privacy and commercial interests of data transmissions.

Consider a typical 17-tap linear feedback shift register 10 as shown in FIG. 1 that is used in a forward packet data channel (F-PDCH) of cdma2000 as a scrambler to generate a scrambling sequence. The scrambler 10 comprises a series of connected registers D1–D17 and an exclusive OR (XOR) gate 12 connected to outputs of the registers D14 and D17. Output of the XOR gate 12 is input into the register D1 providing feedback giving the scrambler 10 a generator sequence of h $(D)=D^{17}+D^{14}+1$. After the registers D1–D17 have been set with an initial state, the scrambler is clocked so that the D17 register outputs the scrambling sequence. The scrambler sequence is used to encode data bits of a communications signal, which in the case of the F-PDCH of cdma2000 means XORing the scrambling sequence with interleaver output symbols.

For the F-PDCH of cdma2000 the operation of the scrambler 10 is as follows. The scrambler 10 is first initialized to an initial state of [D17 . . . D1]= $[1b_{15}b_{14}b_{13}b_{12}b_{11}b_{10}b_{9}b_{8}b_{7}b_{6}b_{5}b_{4}b_{3}b_{2}b_{1}b_{0}]$ where the $b_{15}$, $b_{14}$, $b_{13}$, $b_{12}$, $b_{11}$, $b_{10}$, $b_{9}$, $b_{8}$, $b_{7}$, $b_{6}$, $b_{5}$, $b_{4}$, $b_{3}$, $b_{2}$, $b_{1}$, and b $_{0}$ bits are from a long code mask prescribed in the cdma2000 specification. That is, register D17 is set to "1", register D16 is set to $b_{15}$, and so on with register D1 being set to $b_{0}$. Next, the scrambler 10 is clocked a number of times to generate a scrambling sequence at the output of the register D17. A de-scrambler using the same 17-tap linear feedback shift register 10 must be clocked between 72 and 7776 times to properly set the states of the registers D1–D17 for a particular subpacket. Once this state is reached, the de-scrambler is clocked repeatedly to output the desired scrambling sequence, being the same as that of the scrambler 10.

When the de-scrambler is being clocked by the Fk value it is in a non-performing mode. Naturally, slower overall performance caused by this is more pronounced with higher Fk values. Slower performance of the de-scrambler affects the entire surrounding system and can introduce bottlenecks into otherwise streamlined systems. As it is desirable to avoid delay and increase data transfer rates in mobile phones and other communications systems, the scrambler as described above lacks efficiency. Prior art solutions to this problem include increasing the clock speed of the scrambler, which tends to introduce errors into a transmission.

SUMMARY OF THE INVENTION

It is therefore a primary objective of the claimed invention to provide a scrambler and related method that can quickly step though a sequence of unnecessary intermediate states to solve the problems of the prior art.

Briefly summarized, the claimed invention includes an X-tap linear feedback shift register having X registers, a multiplexer having outputs connected to the registers of the X-tap linear feedback shift register, and a plurality of logic gates connected to inputs of the multiplexer defining a generator sequence. Through the multiplexer, the plurality of logic gates provide parallel input to the X-tap linear feedback shift register that allows for an n-step shift operation of the X-tap linear feedback shift register. Also through the multiplexer, the X-tap linear feedback shift register can perform a single shift operation and can be loaded with a predetermined state.

According to the claimed invention, a method provides a series-parallel linear feedback shift register capable of performing a single step shift operation, performing an n-step shift operation, and being loaded with initial values. The method further loads the series-parallel linear feedback shift register with initial values, performs a predetermined number of n-step shift operations with the series-parallel linear feedback shift register, and performs a predetermined number of single step shift operations with the series-parallel linear feedback shift register. The method finally outputs contents of the series-parallel linear feedback shift register as the scrambling sequence while performing at least a portion of the predetermined number of the single step shift operations.

It is an advantage of the claimed invention that the multiplexer offers the X-tap linear feedback shift register three-mode functionality so that the shift register can be initialized, shifted by n-steps, and the shifted by a single step.

It is a further advantage of the claimed invention that a desired point in the generator sequence can be reached more quickly in proportion to the size of the n-step shift operation.

These and other objectives of the claimed invention will no doubt become obvious to those of ordinary skill in the art after reading the following detailed description of the preferred embodiment that is illustrated in the various figures and drawings.

DETAILED DESCRIPTION

Although the present invention will be described in the context a scrambler used in the forward packet data channel (F-PDCH) of cdma2000, this is not limiting. For example, the present invention applies equally to a de-scrambler, which is a similar device differing mainly by direction of application. Furthermore, the present invention can be applied to other communications systems where data scrambling is required such as computer networks, and further to data encryption in general.

Figure 2:
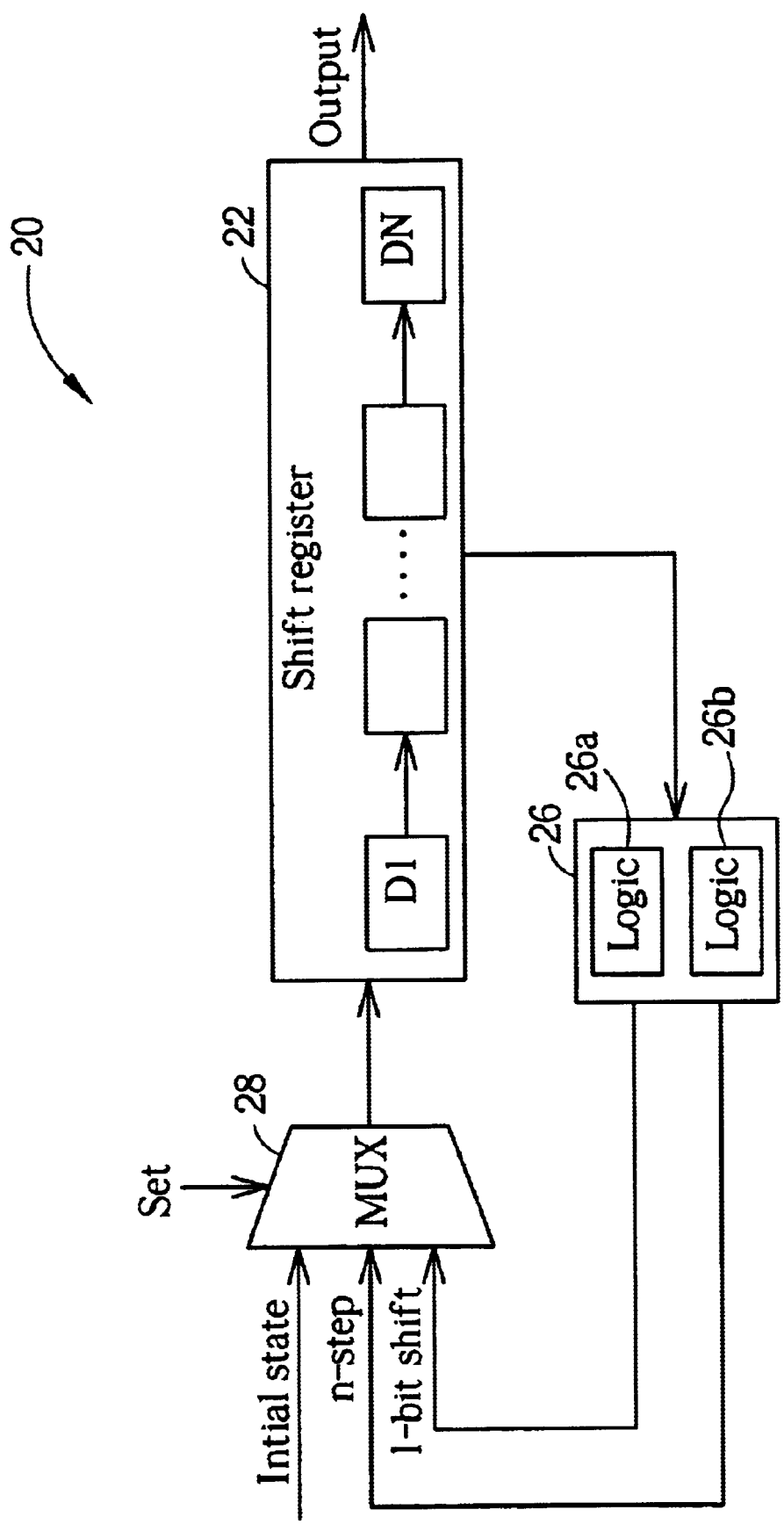
FIG. 2 is a block diagram of a scrambler according to a first embodiment of the present invention.

Please refer to FIG. 2 illustrating a block diagram of a scrambler 20 according to a first embodiment of the present invention. The scrambler 20 comprises a shift register 22 having a plurality of registers D1–DN. The scrambler 20 further includes a plurality of logic gates 26 connected to output of the registers D1–DN of the shift register 22, and a multiplexer 28 for routing output of the logic 26 to inputs of the registers D1–DN of the shift register 22. The plurality of logic gates 26 comprises two sets of logic gates 26a and 26b. The logic 26a provides the multiplexer 28 with output of the registers D1–DN that allows for a single bit shift of the shift register 22 according to a predetermined generator sequence. Conversely, the logic gates 26b provide the multiplexer 28 with output of the registers D1–DN that allows for an n-step shift of the shift register 22 following the predetermined generator sequence. The multiplexer 28, as determined according to setting of selection ends, can select between output of logic 26a, logic 26b, or a predetermined initial state and load the registers D1–DN with the corresponding states. Output of the scrambler 20 is taken from the register DN of the shift register 22.

The scrambler 20 can be operated according to the following procedure. First, the multiplexer 28 is set to accept an initial state that is then set in the registers D1–DN. Then, the multiplexer 28 is set to accept output from the logic gates 26b to change the states of the registers D1–DN for advancing the shift register by n steps according to the generator sequence for a predetermined number of n-steps. Finally, the selection ends of the multiplexer 28 are set so that output of logic 26a is fed into registers D1–DN and a scrambling sequence is output from the shift register 22 as the scrambler is clocked.

Figure 1:
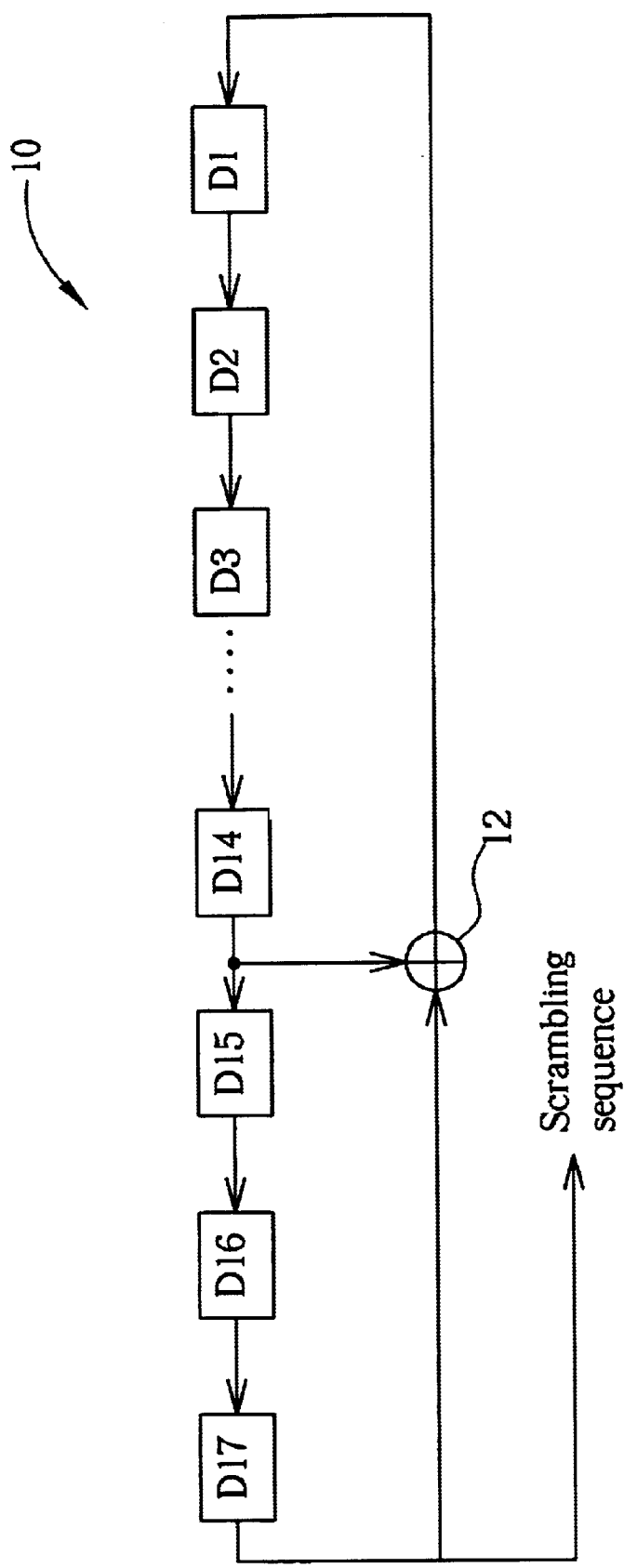
FIG. 1 is a block diagram of a 17-tap linear feedback shift register used as a scrambler according to the prior art.

The structures of the logic 26a and 26b determine how the shift register 22 behaves, and specifically define the predetermined generator sequence. For example, according to the F-PDCH of cdma2000, the quantity of registers D1–DN is seventeen (numbered D1–D17) and the one-bit-shift logic 26a is an XOR gate that XORs output of the fourteenth and seventeenth registers D14, D17 (see FIG. 1) as feedback for the first register D1. This is equivalent to a 17-tap linear feedback shift register describing a generator sequence of $h(D)=D^{17}+D^{14}+1$. Such logic can be described by a feedback matrix:

$$H1 = \begin{vmatrix} 0 & 0 & 0 & 0 & 0 & 0 & 0 & 0 & 0 & 0 & 0 & 0 & 0 & 1 & 0 & 1 \\ 1 & 0 & 0 & 0 & 0 & 0 & 0 & 0 & 0 & 0 & 0 & 0 & 0 & 0 & 0 & 0 \\ 0 & 1 & 0 & 0 & 0 & 0 & 0 & 0 & 0 & 0 & 0 & 0 & 0 & 0 & 0 & 0 \\ 0 & 0 & 1 & 0 & 0 & 0 & 0 & 0 & 0 & 0 & 0 & 0 & 0 & 0 & 0 & 0 \\ 0 & 0 & 0 & 1 & 0 & 0 & 0 & 0 & 0 & 0 & 0 & 0 & 0 & 0 & 0 & 0 \\ 0 & 0 & 0 & 0 & 1 & 0 & 0 & 0 & 0 & 0 & 0 & 0 & 0 & 0 & 0 & 0 \\ 0 & 0 & 0 & 0 & 0 & 1 & 0 & 0 & 0 & 0 & 0 & 0 & 0 & 0 & 0 & 0 \\ 0 & 0 & 0 & 0 & 0 & 0 & 1 & 0 & 0 & 0 & 0 & 0 & 0 & 0 & 0 & 0 \\ 0 & 0 & 0 & 0 & 0 & 0 & 0 & 1 & 0 & 0 & 0 & 0 & 0 & 0 & 0 & 0 \\ 0 & 0 & 0 & 0 & 0 & 0 & 0 & 0 & 1 & 0 & 0 & 0 & 0 & 0 & 0 & 0 \\ 0 & 0 & 0 & 0 & 0 & 0 & 0 & 0 & 0 & 1 & 0 & 0 & 0 & 0 & 0 & 0 \\ 0 & 0 & 0 & 0 & 0 & 0 & 0 & 0 & 0 & 0 & 1 & 0 & 0 & 0 & 0 & 0 \\ 0 & 0 & 0 & 0 & 0 & 0 & 0 & 0 & 0 & 0 & 0 & 1 & 0 & 0 & 0 & 0 \\ 0 & 0 & 0 & 0 & 0 & 0 & 0 & 0 & 0 & 0 & 0 & 0 & 1 & 0 & 0 & 0 \\ 0 & 0 & 0 & 0 & 0 & 0 & 0 & 0 & 0 & 0 & 0 & 0 & 0 & 1 & 0 & 0 \\ 0 & 0 & 0 & 0 & 0 & 0 & 0 & 0 & 0 & 0 & 0 & 0 & 0 & 0 & 1 & 0 \end{vmatrix}$$

wherein each row defines an on-state (binary "1") of a corresponding one register D1–D17 of the shift register 22 (i.e. the first row to D1, the seventeenth row to D17), with each binary "1" indicating wich register(s) D1–D17 (by column number) provide an output to an XOR gate that supplies input to each register. For example, the first row of H1 indicates that the output of register D14 and D17 are XOred then input to register D1; the second row indicates that the output of register D1 is input to register D2; the third row indicate that the output of register D2 is input to register D3; and so on, wherein the last row indicates that the output of register D16 is input to register D17.

Continuing the example, the logic 26b according to the F-PDCH of cdma2000 provides an n-step shift of 24 bits. This is equivalent to performing twenty-four single bit shifts according to the matrix H1, and can be described by the matrix $H1^{24}$ (H1 to the power of 24):

$$H1^{24} = \begin{vmatrix} 0 & 0 & 0 & 1 & 0 & 0 & 0 & 0 & 1 & 0 & 0 & 0 & 0 & 0 & 0 \\ 0 & 0 & 0 & 0 & 1 & 0 & 0 & 0 & 0 & 1 & 0 & 0 & 0 & 0 & 0 \\ 0 & 0 & 0 & 0 & 0 & 1 & 0 & 0 & 0 & 0 & 1 & 0 & 0 & 0 & 0 \\ 0 & 0 & 0 & 0 & 0 & 0 & 1 & 0 & 0 & 0 & 0 & 1 & 0 & 0 & 0 \\ 0 & 0 & 0 & 0 & 0 & 0 & 0 & 1 & 0 & 0 & 0 & 0 & 1 & 0 & 0 \\ 0 & 0 & 0 & 0 & 0 & 0 & 0 & 0 & 1 & 0 & 0 & 0 & 0 & 1 & 0 \\ 0 & 0 & 0 & 0 & 0 & 0 & 0 & 0 & 0 & 1 & 0 & 0 & 0 & 0 & 1 \\ 0 & 0 & 0 & 0 & 0 & 0 & 0 & 0 & 0 & 0 & 1 & 0 & 0 & 1 & 0 & 0 \\ 0 & 0 & 0 & 0 & 0 & 0 & 0 & 0 & 0 & 0 & 0 & 1 & 0 & 0 & 1 & 0 \\ 0 & 0 & 0 & 0 & 0 & 0 & 0 & 0 & 0 & 0 & 0 & 0 & 1 & 0 & 0 & 1 \\ 1 & 0 & 0 & 1 & 0 & 0 & 0 & 0 & 0 & 0 & 0 & 0 & 0 & 0 & 0 & 0 \\ 0 & 1 & 0 & 0 & 1 & 0 & 0 & 0 & 0 & 0 & 0 & 0 & 0 & 0 & 0 & 0 \\ 0 & 0 & 1 & 0 & 0 & 1 & 0 & 0 & 0 & 0 & 0 & 0 & 0 & 0 & 0 & 0 \\ 0 & 0 & 0 & 1 & 0 & 0 & 1 & 0 & 0 & 0 & 0 & 0 & 0 & 0 & 0 & 0 \\ 0 & 0 & 0 & 0 & 1 & 0 & 0 & 1 & 0 & 0 & 0 & 0 & 0 & 0 & 0 & 0 \\ 0 & 0 & 0 & 0 & 0 & 1 & 0 & 0 & 1 & 0 & 0 & 0 & 0 & 0 & 0 & 0 \\ 0 & 0 & 0 & 0 & 0 & 0 & 1 & 0 & 0 & 1 & 0 & 0 & 0 & 0 & 0 & 0 \end{vmatrix}$$

Thus, the logic 26b is significantly more complicated than the logic 26a, however, it can still be realized with XOR gates arranged according to the matrix $H1^{24}$. For example, the first row of $H1^{24}$ indicates that the output of register D5 and D11 are XORed then input to register D1; the second row indicates that the output of register D6 and D12 are XORed then input to register D2; the third row indicates that the output of register D7 and D13 are XORed then input to register D3; and so on, wherein the last row indicates that the output of register D7 and D10 are XORed then input to register D17.

Generally, the shift register 22 of the scrambler 20 outputs a scrambling sequence as defined by the generator sequence of the logic 26a. The scrambling sequence can be quickly stepped through by n-steps to reach a desired point according to the logic 26b. Additionally, the registers D1–DN of the shift register 22 can be loaded with predetermined states. The multiplexer 28 controls these three functions of the scrambler 20 to generate a desired scrambling sequence.

Figure 3:
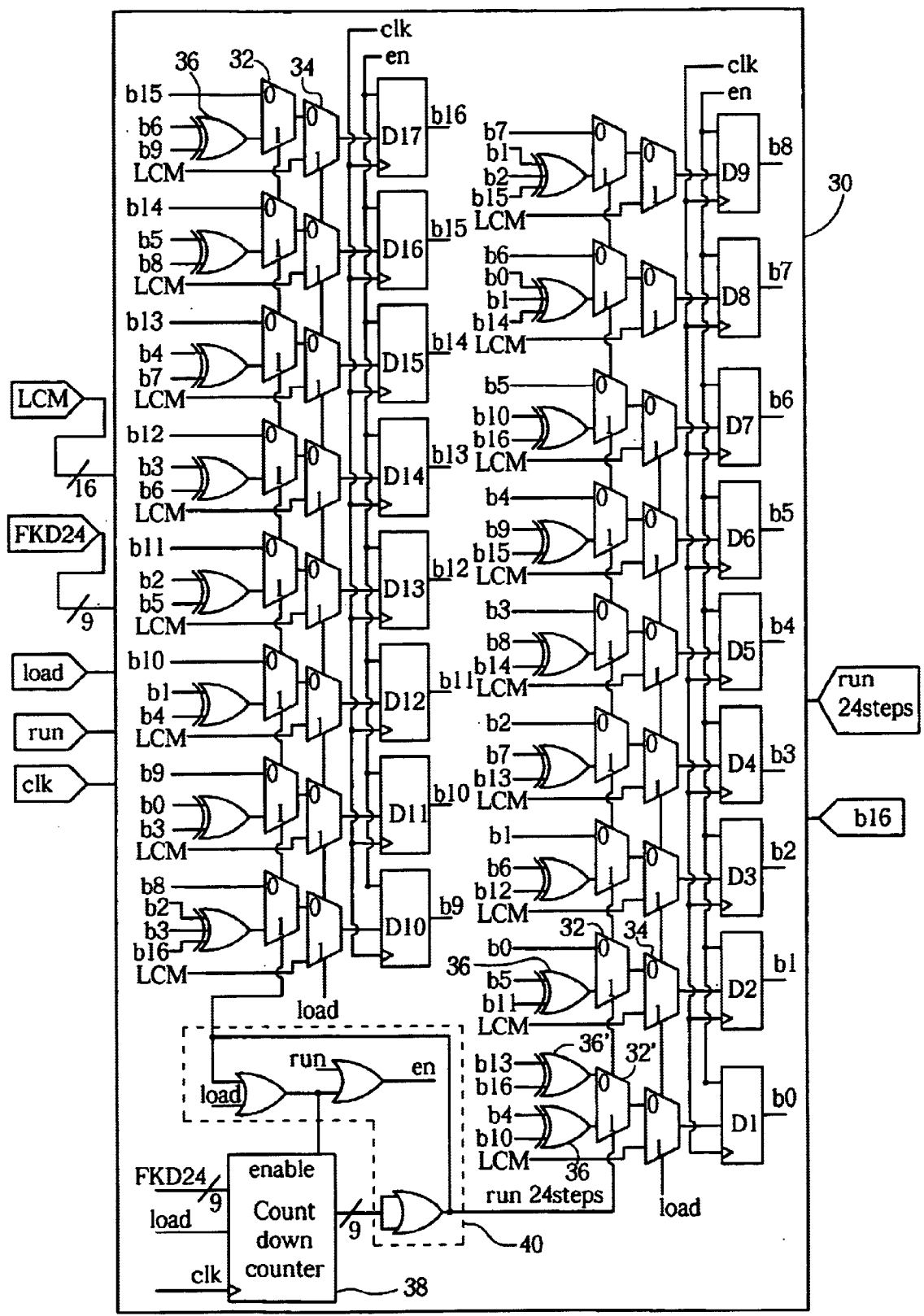
FIG. 3 is a block diagram of a scrambler according to a second embodiment of the present invention.

Please refer to FIG. 3 showing a block diagram of a scrambler 30 according to a second embodiment of the present invention. The scrambler 30 includes registers D1–D17 each having an input, an output, and enable and clock ends. The outputs of the registers D1–D17 are denoted as b0–b16. The scrambler 30 further includes two sets of two-input multiplexers illustrated as multiplexers 32, 32" and 34. Output of each multiplexer 34 is to a corresponding register D1–D17. Input to each multiplexer 34 is output of a corresponding multiplexer 32, 32" and a bit of a predetermined long code mask (LCM). Each multiplexer 32 accepts input from a previous register and input from a XOR gate 36, which XORs output of registers according to the $H1^{24}$ matrix previously described. The multiplexer 32" accepts input from a XOR gate 36 similar to each multiplexer 32 and further from a XOR gate 36" corresponding to the matrix H1. For example, the register D4 outputs a state b3, can accept input b2 from the previous register D3, can further accept a XORed result of the outputs b7, b13 from registers D8, D14, and can finally accept a bit of the LCM. To clarify, all registers D2–D17 are connected to a multiplexer 34, which is connected to a multiplexer 32 that accepts input from an XOR gate 36; and the register D1 is connected to a multiplexer 34, which is connected to a multiplexer 32" that accepts input from XOR gates 36, 36". As can be seen in FIG. 3, the registers D1–D17 can function as a 17-tap linear feedback shift register for shifting a single bit, a 17-tap linear feedback shift register having parallel inputs that enable a jump of 24 bits, and can be set with a predetermined state or LCM depending on setting of the multiplexers 32, 32", and 34. Table 1 summarizes the operating modes of the scrambler 30 in relation to the input-to-output selection at the multiplexers 32, 32", and 34.

TABLE 1

| Selected input at MUXs 32, 32' | Selected input at MUXs 34 | Mode |
| --- | --- | --- |
| 0 | 0 | 1 bit shift |
| 0 | 1 | Load LCM |
| 1 | 0 | Jump 24 bits |
| 1 | 1 | Load LCM |

The scrambler 30 further includes a countdown counter 38 and control logic 40. The control logic 40 comprises OR gates arranged so that a "run" input enables the registers D1–D17, a "load" input sets the multiplexers 34 to load the registers D1–D17 with the LCM bits, and a clock "clk" input synchronizes operation of the registers D1–D17 with the counter 38. The control logic 40 can further output a "run 24 steps" bit to indicate that the scrambler is performing a 24-bit jump. The counter 38 is a 9-bit counter, 9 bits being selected for the F-PDCH of cdma2000 so that 324 jumps ($2^9$=512>324) of 24 bits can be made to reach the 7776th state of the scrambler 30. The counter 38 accepts a 9-bit input "FKD24" (Fk divided by 24) which has a binary value ranging from 3 to 324 corresponding to states 72 to 7776. The logic 40 ensures that as the counter 38 counts down, the multiplexers 32, 32", and 34 are set for the scrambler 30 to jump 24 bits. The scrambling sequence is output b16 from register D17.

An example will now be described to clarify the second embodiment. If a subpacket symbol selection device selects a scrambling sequence to start from an Fk value of 120, the "load" signal is initially set to "1", which allows the multiplexers 34 to load the registers D1–D17 with the LCM bits before the "load" signal is set back to "0". Next, instead of clocking the registers D1–D17 for 120 times to get to the starting bit of the scrambling sequence of that particular subpacket symbol, the "FKD24" signal is provided with a value equal of 5 (120/24) which sets the "run 24 steps" signal to "1" and causes the multiplexers 32, 32" to output the data at their inputs "1". Thus, the scrambler 30 operates under the "Jump 24 bits" mode and executes the first 24-bit jump. The countdown counter 38 then counts down from 5 to 4 in the next clock cycle, the "run 24 steps" signal still remains at "1" and another 24-bit jump is executed. The scrambler 30 operates under the "Jump 24 bits" mode for 5 clock cycles until the output of the countdown counter 38 counts down to zero which resets the "run 24 steps" signal to "0". At this stage, the output of register D17 (which is b16) is the starting bit of the scrambling sequence of that particular subpacket symbol (of Fk=120), and from here on, the scrambler 30 operates under the "1 bit shift" mode and generates the scrambling sequence bit by bit (clock by clock) at b16.

In both embodiments the logic 26, 36, and 36" can be realized with XOR gates as described, however, other similarly functioning logic could be substituted. Similarly, the multiplexers 28, 32, 32", and 34 are described as such for convenience and in practical application could be switching circuits, logic gates, or similar devices. Additionally, the multiplexers 28, 32, 32", and 34 could be of different forms that still provide the functionality described. For instance, each pair of two-input multiplexers 32, 34 in the second embodiment could easily be replaced with one three-input multiplexer. Furthermore, when the present invention is applied to cases other than the cdma2000 example above, the inputs to the logic gates, structures of the control logic and counter, the predetermined initial value (LCM), and the output taken would be different than those described.

Figure 4:
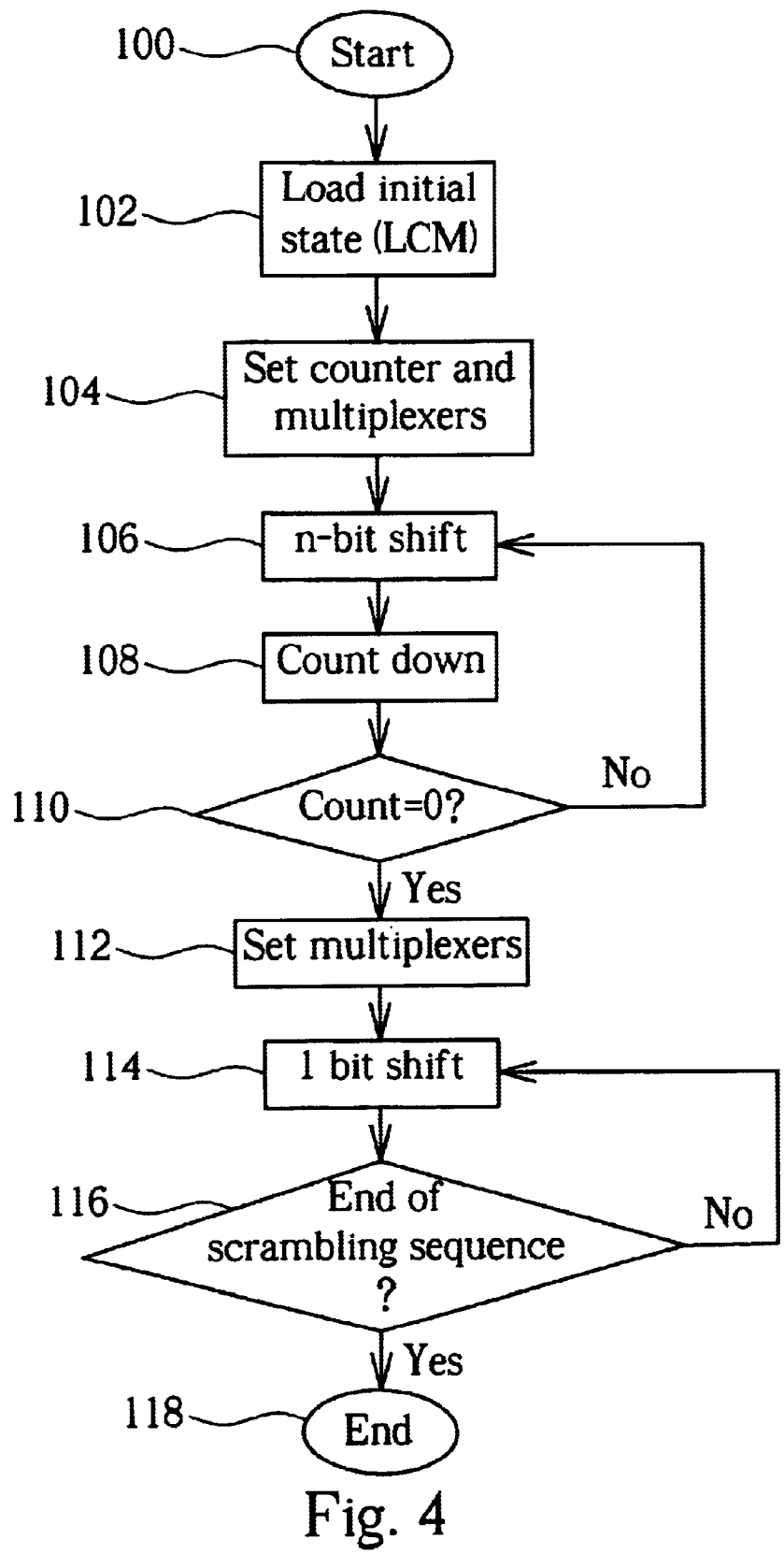
FIG. 4 is a flowchart of a method for generating a scrambling sequence according to the present invention.

Please refer to FIG. 4 showing a flowchart of a method for generating a scrambling sequence according to the present invention. The method is described in conjunction with the scrambler 30 as follows:

Step 100: Start;

Step 102:

Select input "1" of the multiplexers 34 as the output for loading the initial state or LCM into the registers D1–D17;

Step 104:

Set the counter 38 to a predetermined number (3–324) of 24-bit shifts and set the multiplexers 32, 32", and 34 to states "1", "1", and "0" respectively to perform a 24bit shift of the registers D1–D17 according to the generator sequence;

Step 106: Perform a 24-bit shift by clocking the registers D1–D17 and the counter 38;

Step 108: Decrement the state of the counter 38 by one;

Step 110:

Is the state of the counter 38 equal to zero? If it is, go on to step 112; if not, return to step 106;

Step 112:

Set the multiplexers 32, 32" to the state "0" (multiplexers 34 are already set to "0") to perform a single bit shift of the registers D1–D17 according to the generator sequence;

Step 114:

Perform a single bit shift by clocking the registers D1–D17, where the scrambling sequence is output from the register D17;

Step 116:

Is the end of the scrambling sequence reached? If it is, go to step 118; if not, return to step 114;

Step 118: End.

The end of the scrambling sequence is determined by a component or user external to the scrambler 30. In cdma2000 this is determined by a packet length of information to be scrambled. Naturally, the method as described could be similarly used with the scrambler 20.

In contrast to the prior art, the present invention can load registers with initial values, generate a series of n-step jumps of a generator sequence, and generate a single step output of the generator sequence as a scrambling sequence. Where the prior art scrambler must be advanced linearly in single steps to reach a desired state, the present invention scrambler can be quickly advanced though parallel input. Considering the above-mentioned cmda2000 example. If the prior art scrambler is to reach an Fk value of 5088, it must undergo at least 5088 clock cycles. In contrast, the present invention in the same example would merely have to undergo 212 clock cycles, and thus is 24 times faster. Thus, the present invention scrambler offers the improvement of high-speed performance.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A scrambler for generating a scrambling sequence, the scrambler comprising:

an X-tap linear feedback shift register having X registers arranged in a linear series for outputting the scrambling sequence according to a predetermined generator sequence;

a multiplexer having outputs connected to the registers of the X-tap linear feedback shift register, the multiplexer further having a first set of inputs, a second set of inputs, and a third set of inputs, the third set of inputs being connected to outputs of registers of the X-tap linear feedback shift register for performing a single step shift operation of the X-tap linear feedback register; and a plurality of logic gates connected to the second set of inputs of the multiplexer and to outputs of the registers for performing an n-step shift operation of the X-tap linear feedback register;

wherein the sets of inputs correspond to states of selection ends of the multiplexer; and the selection ends of the multiplexer are capable of being set to select the first set of inputs to load the registers of the X-tap linear feedback shift register with a predetermined state, select the second set of inputs to perform the n-step shift operation of the X-tap linear feedback shift register, and select the third set of inputs to perform the single shift operation of the X-tap linear feedback shift register.

2. The scrambler of claim 1 further comprising a counter connected to the selection ends of the multiplexer for setting the states of the selection ends for a predetermined number of clock pluses.

3. The scrambler of claim 1 wherein the plurality of logic gates are XOR gates.

4. The scrambler of claim 1 wherein the X-tap linear feedback shift register is a 17-tap linear feedback shift register having 17 registers, wherein input of a first register comprises output of a fourteenth register XORed with output of a seventeenth register so that the predetermined generator sequence is $h(D)=D^{17}+D^{14}+1$.

5. The scrambler of claim 4 wherein the n-step shift operation is a 24-bit shift operation.

6. The scrambler of claim 5 as part of a device operating in a forward packet data channel (F-PDCH) of a code division multiple access specification (cdma2000) for third generation (3G) wireless communication systems.

7. A scrambler for generating a scrambling sequence, the scrambler comprising:

a series of registers, each register having an input and an output;

a series of multiplexing means, each multiplexing means for selecting one of a first input, a second input and a third input, and to provide the selected input to a corresponding register; wherein each first input is connected to an initial value input to perform an initial value loading operation, and each third input is fed from the output of a previous register to perform a single step shift operation;

a series of paralleling XOR means for performing an n-step shift operation, each paralleling XOR means having an output connected to the second input of a corresponding multiplexing means; and a tap XOR means with output connected to the third input of the multiplexing means corresponding to a first register for performing the single step shift operation;

wherein inputs to the series of paralleling XOR means and the tap XOR means are outputs of the series of registers arranged such that the series of registers form a series-parallel linear feedback shift register; and the series of multiplexing means is capable of being set so that the series-parallel linear feedback shift register is capable of performing the single step shift operation, performing the n-step shift operation, or performing the initial value loading operation.

8. The scrambler of claim 7 further wherein the series of registers comprises 17 registers, the series of multiplexing means comprises 17 multiplexers each capable of at least three-to-one selection functionality, and the series of paralleling XOR means comprises 17 XOR gates.

9. The scrambler of claim 8 wherein inputs to the series of paralleling XOR gates and the tap XOR gate are outputs of the series of registers arranged such that the series-parallel linear feedback shift register is a 17-tap linear feedback shift register consistent with a generator sequence of $h(D)=D^{17}+D^{14}+1$.

10. The scrambler of claim 9 wherein the n-bit shift operation is a shift of 24 bits consistent with a 17-tap linear feedback shift register.

11. The scrambler of claim 10 further comprising a counter for setting the multiplexing means for a predetermined number of clock pluses for performing a succession of 24-bit shift operations.

12. The scrambler of claim 10 as part of a device operating in a forward packet data channel (F-PDCH) of a code division multiple access specification (cdma2000) for third generation (3G) wireless communication systems.

13. A method for generating a scrambling sequence, the method comprising:

providing a series-parallel linear feedback shift register capable of performing a single step shift operation, performing an n-step shift operation, and being loaded with initial values;

loading the series-parallel linear feedback shift register with initial values;

performing a predetermined number of n-step shift operations with the series-parallel linear feedback shift register; and performing a predetermined number of single step shift operations with the series-parallel linear feedback shift register.

14. The method of claim 13 further comprising outputting contents of the series-parallel linear feedback shift register while performing at least a portion of the predetermined number of the single step shift operations, said output being the scrambling sequence.

15. The method of claim 13 wherein performing the predetermined number of n-step shift operations is according to output of a counter.

16. The method of claim 13 wherein the series-parallel linear feedback shift register is a 17-tap linear feedback shift register having a generator sequence of $h(D)=D^{17}+D^{14}+1$, the n-step shift operations are 24-bit shift operations, and the predetermined number of n-step shift operations is between 3 and 324.

17. A device for performing the method of claim 13.

* * * * *